United States Patent
Akino et al.

(10) Patent No.: US 7,295,675 B2
(45) Date of Patent: Nov. 13, 2007

(54) PHANTOM POWERED CAPACITOR MICROPHONE AND A METHOD OF USING A VACUUM TUBE IN THE SAME

(75) Inventors: Hiroshi Akino, Sagamihara (JP); Tatsuo Kioke, Machida (JP); Shioto Okita, Sagamihara (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 772 days.

(21) Appl. No.: 10/827,161

(22) Filed: Apr. 19, 2004

(65) Prior Publication Data

US 2004/0196990 A1    Oct. 7, 2004

(30) Foreign Application Priority Data

Jan. 15, 2003 (JP) .................................. 2003-6621

(51) Int. Cl.
H04R 3/00 (2006.01)
H04R 19/04 (2006.01)
(52) U.S. Cl. ........................ 381/113; 381/174
(58) Field of Classification Search ............. 381/113, 381/174
See application file for complete search history.

(56) References Cited

U.S. PATENT DOCUMENTS

| | | | | |
|---|---|---|---|---|
| 3,595,998 A | * | 7/1971 | Fidi et al. ................. | 381/120 |
| 3,944,756 A | * | 3/1976 | Lininger .................... | 381/174 |
| 4,541,112 A | * | 9/1985 | Kern ......................... | 381/113 |
| 6,453,048 B1 | * | 9/2002 | Akino ........................ | 381/113 |

* cited by examiner

*Primary Examiner*—Daniel Swerdlow
(74) *Attorney, Agent, or Firm*—Welsh & Katz, Ltd.

(57) ABSTRACT

The present invention provides a low noise phantom powered capacitor microphone and a method of using a vacuum tube as an impedance converter of the microphone capsule in the capacitor microphone with no exclusive power supply.

In the phantom powered capacitor microphone of which a vacuum tube V01 is used as the impedance converter, a part of the voltage supplied from the phantom power supply is converted to a predetermined voltage by one or more switched capacitor voltage converters, for example, by three switched capacitor voltage converters IC01, IC02 and IC03 seriously connected as three stages to obtain the heater voltage of the vacuum tube V01.

7 Claims, 1 Drawing Sheet

PHANTOM POWERED CAPACITOR MICROPHONE AND A METHOD OF USING A VACUUM TUBE IN THE SAME

FIELD OF THE INVENTION

The present invention relates to a capacitor microphone powered by a phantom power supply (a phantom powered capacitor microphone) and especially relates to the phantom powered capacitor microphone and a method of using a vacuum tube as an impedance converter of a microphone capsule thereof.

BACKGROUND OF THE INVENTION

A FET (Field Effect Transistor) or a vacuum tube is used as an impedance converter of a capacitor microphone, because impedance between a vibrating plate and a fixed electrode placed and faced to each other in a capacitor microphone capsule is remarkably high.

When a vacuum tube is used as an impedance converter of a capacitor microphone, exclusive power supplies generally need to be prepared. A heater power supply for heating a heater and a plate power supply for flowing a plate current are necessary for operating the vacuum tube.

Generally, a vacuum tube which is used as an impedance converter needs a heater power supply of 6.3V, 0.35 A and a plate power supply of 120V, 10 mA. Therefore, since a general 48V phantom power supply cannot afford to supply that power, the exclusive power supplies are used.

A dry battery powered vacuum tube which has small power consumption is in existence. For example, type no. 6418 of a directly heated pentode vacuum tube of Raytheon company meets the requirement. This vacuum tube has been developed for a hearing aid and can be operated by a heater power supply of 1.25V, 10 mA and a plate power supply of 30V, 0.24 mA.

A vacuum tube which has as small the power consumption as the above-described power can be operated by the general 48V phantom power supply. However, when the heater power of 1.25V, 10 mA is directly stabilized from the phantom power by a zener diode or the like, the voltage supplied from the phantom power supply is decreased because the current of 10 mA flows to the heater of the vacuum tube.

For example, when 10 mA flows to the heater of the vacuum tube, the voltage supplied to the microphone from the phantom power supply decreases the voltage of 34V (5 mA×6.8 kΩ) and the voltage supplied to the microphone results in 14V. In this condition, the power supplied to the plate of the vacuum tube is insufficient and the vacuum tube cannot be operated.

Therefore, it is contemplated that a down-converter which converts a higher voltage to a lower voltage can be used. That is, a larger current is obtained from a smaller current by the down-converter. However, following problems will occur.

One of the problems will described hereinafter. Many converting methods for down converters are available. However, the pulse width modulation method, such as used in type no. MAX1733 of Low-Voltage Step-Down DC-DC Converter of Maxim Integrated Products, is generally used.

Since in the converter using the pulse width modulation method, the input voltage of the converter is switched on and off, large noise is generated because of the switching. The noise enters to a supply voltage, and then, the noise increases a microphone noise.

Further, since an inductor is used in the pulse width modulation converter, an external magnetic field is generated by the current with noise flowing in the inductor and the external magnetic field is magnetically coupled with an output transformer of a microphone, whereby the microphone noise is generated.

The other problem is that the down-converter which can convert 10V to 1.25V is rarely-offered in markets, because it's application is limited.

SUMMARY OF THE INVENTION

The subject matter of this invention is that in a phantom powered capacitor microphone of which a vacuum tube is used as an impedance converter, in order to heat the heater of the vacuum tube a heater power supply including a down-converter which generates no noise and which is easily-offered in markets is obtained from the phantom power supply.

To achieve the above-described subject matter, it is characterized in that in the phantom powered capacitor microphone of which the vacuum tube is used as the impedance converter, a part of the voltage supplied from the phantom power supply is converted to the predetermined voltage by one or more switched capacitor voltage converters to obtain the heater voltage of the vacuum tube.

The switched capacitor voltage converter includes an oscillator for a switching control, a semiconductor switch having a CMOS or the like and an external capacitor storing electric charge. The oscillator switches on and off the semiconductor switch to charge and discharge the capacitor, so that the output voltage of the converter is double-boosted or half-stepped down from the input voltage. For example, one of these kinds of converters is type no. LM2665 of National Semiconductor Corporation.

Since the electric charge of this kind of the converter is controlled only by charge and discharge of the capacitor, the noise generated in the switched capacitor voltage converter is not as large as in the pulse width modulation converter. The output voltage of the switched capacitor voltage converter is proportional to the input voltage thereof, and then, the stabilized output voltage of the converter is obtained based on the stabilized input voltage thereof.

Therefore, an input circuit is connected to the input of the switched capacitor voltage converter to stabilize the input voltage of the converter. The input circuit includes a zener diode to stabilize the input voltage of the converter and a smoothing capacitor to more stabilize the voltage. The circuit further includes a current limit resister. The resistor is disposed at the up-stream of the zener diode to set the current flowing to the converter to a predetermined value, whereby an optimized voltage and an optimized current are supplied to the heater of the vacuum tube from the heater power supply.

The voltage supplied from the phantom power supply applies to a constant current circuit and the stabilized output current from the constant current circuit is divided to flow to the plate of the vacuum tube and to the current limit resistor of the input circuit. Therefore, the predetermined value of the plate current is supplied to the plate of the vacuum tube and the predetermined value of the heater current is also supplied to the heater of the vacuum tube.

According to this invention, a dry battery powered vacuum tube having small power consumption is preferably employed as the vacuum tube which is used as the impedance converter of the capacitor microphone capsule. For example, one of these kinds of the vacuum tubes is type No. 6418 of a directly heated pentode vacuum tube of Raytheon company.

DETAILED DESCRIPTION OF THE PREFERRED EMBODIMENTS

Figure 1:
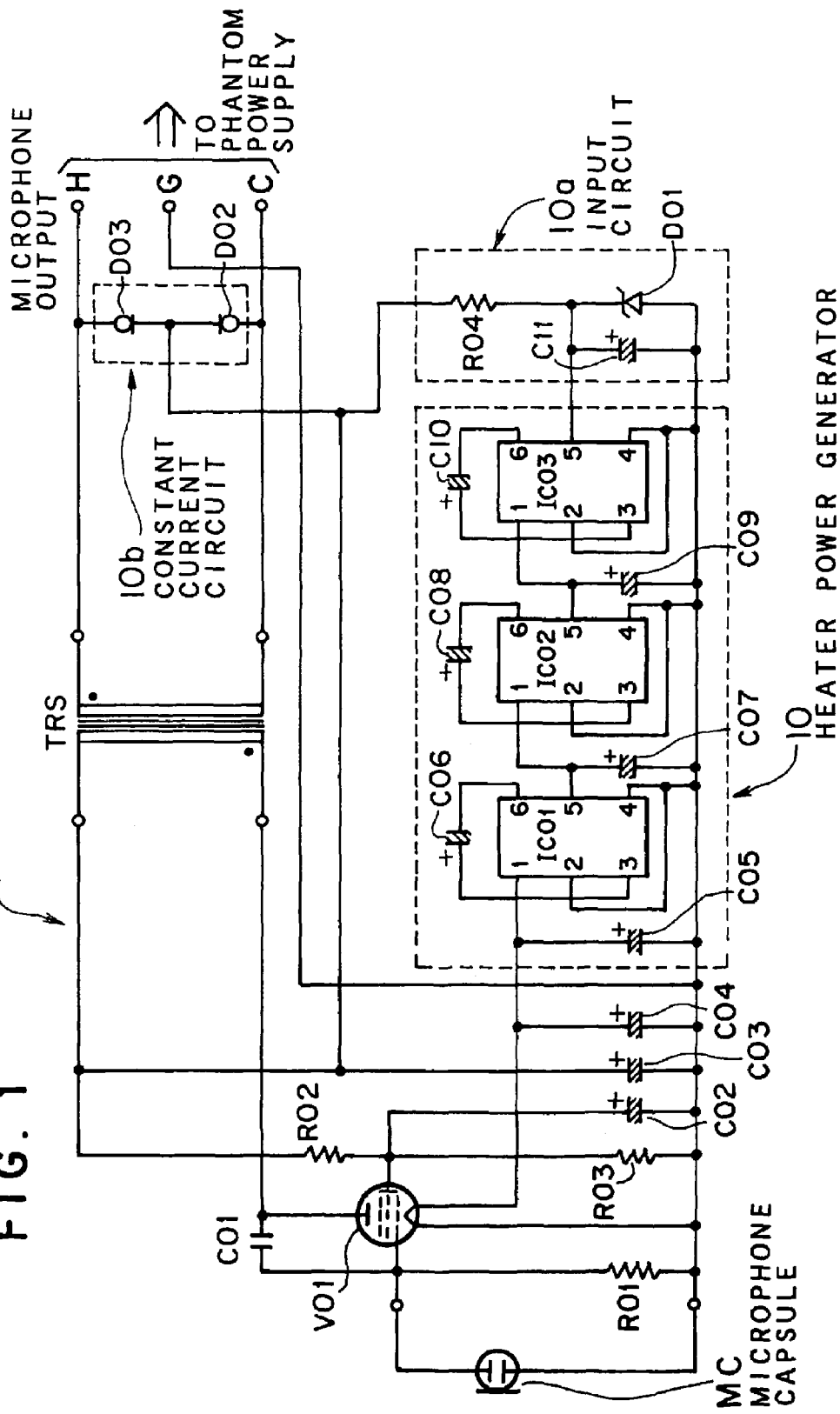
FIG. 1 is a capacitor microphone circuit diagram showing one aspect of the present invention.

An embodiment of this invention will be described according to a circuit diagram of a capacitor microphone 1 as shown in FIG. 1. The capacitor microphone of this invention is powered by a phantom power supply (phantom powered capacitor microphone). The phantom power supply (not shown), which is publicly known, includes two 6.8 kΩ resistors seriously connected between the hot side and the cold side of the balance-transmission and a DC 48 V power supply connected between the connecting point of the two resistors and the ground.

In FIG. 1 MC is a microphone capsule (so called a mike) of the capacitor microphone. The capsule is an electret capacitor type microphone capsule in this embodiment, however the capsule also may be a kind of a capsule which needs a polarization power supply.

V01 is a vacuum tube which is used as an impedance converter connected to the microphone capsule MC. In this embodiment, type no. 6418 of a directly heated pentode vacuum tube of Raytheon company is used. The vacuum tube V01 can be operated by a heater power supply 1.25V, 10 mA and a plate power supply 30V, 0.24 mA.

R01 is a bias resistor for the control grid of the vacuum tube V01. C01 is a feed back capacitor from the plate to the control grid of the vacuum tube V01. R02 and R03 are voltage dividing resistors to apply voltage to the screen grid of the vacuum tube V01.

A microphone output is provided with terminals H, C and G, respectively, connected to the hot side, the cold side and the ground side of the phantom power supply. The terminals H and C are connected to the vacuum tube V01 through an output transformer TRS. Connected to the terminal G are the ground of the microphone capsule, the ground of the heater of the vacuum tube V01 and so on.

The capacitor microphone includes a heater power generator 10 for supplying a heater power to the vacuum tube V01 from the phantom power supply. The generator 10 includes at least one switched capacitor voltage converter IC (Integrated Circuit). Hereinafter the switched capacitor voltage converter IC may be abbreviated as the converter IC. The output of the generator is connected to the heater of the vacuum tube V01.

In this embodiment, IC01, IC02 and IC03 of three converter ICs are seriously connected as three stages, each of which is type no. LM2665 of National Semiconductor Corporation.

The LM2665 converter IC has a 6-pin configuration. When a positive voltage is inserted to No. 1 pin of the IC, the voltage output from No. 5 pin is two times higher than the input voltage. That is, the converter IC is operated as a double boosting voltage converter. To the contrary, when a positive voltage is inserted to No. 5 pin of the IC, a half of the input voltage is output from No. 1 pin, in which the converter IC is operated as a half step down converter.

In this embodiment, each of the converter ICs is operated as a half step down converter, and each of the positive voltages is inserted to each of No. 5 pins of IC01, IC02 and IC03 to obtain a half of the input voltage from each of No. 1 pins.

No. 2 pin of the converter IC is a ground pin and No. 4 pin is a shutdown control pin. Charge pump capacitors C06, C08 and C10 are connected, respectively, between No. 3 and No. 6 pins of each of the converter ICs. In this embodiment, since each of the converter ICs is operated as the half step down converter, each of the positive leads of the charge pump capacitors is connected to each of No. 3 pins of the converter ICs. When each of the converter ICs is operated as the double boosting voltage converter, each of the negative leads of the charge pump capacitors is connected to each of No. 3 pins of the converter ICs. Connected, respectively, to each of No. 1 pins which are the outputs of the converter ICs are capacitors C05, C07 and C09 for smoothing current and passing AC (Alternative Current) to the ground.

Connected to the heater power generator 10 is an input circuit 10a having a current limit resistor R04, a zener diode D01 and a capacitor C11. The resistor and the diode seriously connected. Connected to the input circuit 10a is a constant current circuit 10b having a first and a second constant current diodes D02, D03 to flow a predetermined value of current to the input circuit 10a from the terminals H and C connected to the phantom power supply.

In this embodiment, the power of 30V, 1.5 mA is supplied to the input circuit 10a from the first and the second constant current diodes D02, D03 of the constant current circuit 10b. The zener diode D01 of the input circuit 10a restricts 30V to 10V as the input voltage of the heater power generator 10 and the current limit resistor R04 restricts the input current of the heater power circuit to 1.25 mA.

In the first, the second and the third converter ICs IC03, IC02 and IC01, the voltage of 10V is converted to 5V, to 2.5V, and to 1.25V in sequence. The current of 1.25 mA is also converted to 2.5 mA, to 5.0 mA, and to 10 mA in sequence. The heater power of 1.25V, 10 mA results to be supplied to the heater of the vacuum tube V01 from the third converter IC.

Thus, since the current flowing into the heater power generator 10 from the phantom power supply is only 1.25 mA, the voltage drop due to heating the heater is only approximately 4.25V (0.5×1.25 mA×6.8 kΩ) so that the plate power for flowing the plate current of the vacuum tube V01 is sufficiently ensured. In FIG. 1, the reference symbols and numerals C02, C03, C04 and C11 are smoothing capacitors.

According to the above-described present invention, in the phantom powered capacitor microphone of which the vacuum tube is used as the impedance converter, a part of the voltage supplied from the phantom power supply is converted to the predetermined voltage by one or more switched capacitor voltage converters to obtain the heater voltage of the vacuum tube, whereby the low noise phantom powered vacuum tube capacitor microphone with no exclusive power supply is provided.

The invention claimed is:

1. A phantom powered capacitor microphone, comprising:
a microphone capsule including a vibrating plate and a fixed electrode;
a vacuum tube used as an impedance converter of the microphone capsule;
a heater power generator for generating the heater voltage of the vacuum tube, said heater power generator including one or more switched capacitor voltage converters and generating the heater voltage of the vacuum tube by utilizing a part of the voltage supplied from a phantom power supply;

an input circuit connected to the input of the heater power generator for stabilizing the input voltage of the heater power generator; and a constant current circuit receiving an electric current from the phantom power supply and flowing a stabilized current to a plate of the vacuum tube and to the input circuit.

2. A phantom powered capacitor microphone according to claim 1, wherein the vacuum tube has small power consumption and can be powered by a dry battery.

3. A phantom powered capacitor microphone according to claim 1, wherein the input circuit includes a zener diode, a current limit resister and a smoothing capacitor.

4. A phantom powered capacitor microphone according to claim 1, wherein the constant current circuit includes a first and a second constant current diodes, the one ends of the first and the second constant current diodes connected, respectively, to the hot side (H) and the cold side (C) of the phantom power supply, the other ends of the first and the second constant current diodes connected to each other, the connecting point connected to the plate side of the vacuum tube and the input circuit.

5. A method of using a vacuum tube in a phantom powered capacitor microphone, comprising the steps of:

providing a dry battery powered vacuum tube having low power consumption as an impedance converter of a microphone capsule;

generating the heater voltage of the vacuum tube by a heater power generator including one or more switched capacitor voltage converters by utilizing a part of the voltage supplied from a phantom power supply;

stabilizing the heater voltage of the vacuum tube by an input circuit connected to the input of the heater power generator; and stabilizing current flowing to the plate of the vacuum tube and the input circuit by a constant current circuit receiving an electric current from the phantom power supply.

6. A method of using a vacuum tube in a phantom powered capacitor microphone according to claim 5, wherein the input circuit includes a zener diode, a current limit resister and a smoothing capacitor.

7. A method of using a vacuum tube in a phantom powered capacitor microphone according to claim 5, wherein the constant current circuit includes a first and a second constant current diodes, the one ends of the first and the second constant current diodes connected, respectively, to the hot side (H) and the cold side (C) of the phantom power supply, the other ends of the first and the second constant current diodes connected to each other, the connecting point connected to the plate side of the vacuum tube and the input circuit.

* * * * *